(12) United States Patent
Kawamura et al.

(10) Patent No.: US 7,119,409 B2
(45) Date of Patent: Oct. 10, 2006

(54) ORGANIC EL DISPLAY

(75) Inventors: Yukinori Kawamura, Nagano (JP); Kenya Sakurai, Nagano (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 0 days.

(21) Appl. No.: 10/520,010

(22) PCT Filed: Jun. 13, 2003

(86) PCT No.: PCT/JP03/07566

§ 371 (c)(1),
(2), (4) Date: Jan. 19, 2006

(87) PCT Pub. No.: WO2004/112439

PCT Pub. Date: Dec. 23, 2004

(65) Prior Publication Data

US 2006/0113617 A1    Jun. 1, 2006

(51) Int. Cl.
*H01L 27/14* (2006.01)
(52) U.S. Cl. .................. 257/414; 257/414; 257/40; 257/E51.018
(58) Field of Classification Search ............ 257/414, 257/40, 72
See application file for complete search history.

(56) References Cited

U.S. PATENT DOCUMENTS 6,114,805 A * 9/2000 Codama et al. ............ 313/509

FOREIGN PATENT DOCUMENTS

| JP | 05-094878    | 4/1993  |
|----|--------------|---------|
| JP | 08-124677    | 5/1996  |
| JP | 10-289784    | 10/1998 |
| JP | 2000-150156  | 5/2000  |
| JP | 2001-338754  | 7/2001  |
| JP | 2003-036974  | 7/2001  |
| JP | 2003-163078  | 6/2003  |

* cited by examiner

*Primary Examiner*—Andy Huynh
*Assistant Examiner*—Thinh T Nguyen
(74) *Attorney, Agent, or Firm*—Rabin & Berdo, P.C.

(57) ABSTRACT

In the case of a top emission structure color organic EL display in which are bonded together a substrate having thin film transistors formed thereon and a transparent substrate having color-converting filters formed thereon, an overcoat layer for adjusting the gap between the substrates and an overcoat layer for relieving stress are formed between the substrates without providing a space between the overcoat layers and the EL device, whereby there can be provided an organic EL display having high reliability, with the occurrence of voids that would have an adverse effect on the display performance being prevented, and the occurrence of thermal and mechanical stress being suppressed.

3 Claims, 1 Drawing Sheet

ORGANIC EL DISPLAY

CROSS REFERENCE TO RELATED APPLICATION

The present application incorporates herein by reference the entire disclosure and contents of the corresponding PCT application PCT/JP2003/007566, filed on Jun. 13, 2003. Also incorporated by reference are the entire disclosure and contents of the earlier corresponding Japanese application JP PA 2002-085485.

TECHNICAL FIELD

The invention relates to an organic EL (electroluminescent) display with high definition and excellent reliability, that can be used in a wide range of applications such as a display in mobile terminal equipment or industrial measuring equipment.

BACKGROUND TECHNOLOGY

In recent years, color organic EL displays with a driving method using thin film transistors (TFTs) have been developed. With a method in which the light is extracted from the side of the substrate on which the TFTs are formed, due to the effect of wiring parts blocking the light, the aperture ratio cannot be raised; recently, a so-called top emission method in which the light is extracted from the opposite side to the substrate on which the TFTs are formed has thus been developed.

On the other hand, there have been advances in development of a color conversion method in which patterned fluorescent bodies are made to absorb light emitted from an organic EL device and hence fluorescence of a plurality of colors is emitted from the fluorescent bodies. By using this method together with the top emission method using TFT driving, there is the possibility of being able to provide an organic EL display having yet higher definition and higher brightness. The color displays disclosed in Japanese Patent Application Laid-open No. 11-251059 and Japanese Patent Application Laid-open No. 2000-77191 are examples of such a system.

As a structure of a top emission display using the color conversion method, in Japanese Patent Application Laid-open No. 11-297477 there is disclosed a structure in which an organic EL device and color-converting filters (color-converting layers alone or laminates of color filter layers and color-converting layers) are disposed facing a transparent electrode on the upper side of the organic EL device with a fixed gap provided therebetween by a columnar gap-adjusting layer disposed therebetween. Moreover, a structure in which this gap is filled with an insulating oil or the like is disclosed in Japanese Patent Application Laid-open No. 3-92398.

However, with the constitution in which a fixed gap is provided using a columnar structure (support), there is a gas layer (void) having a greatly different refractive index between the organic EL layer and the color-converting filters, and hence there is much reflection of light at the interface between the gas layer and the organic EL device, and at the interface between the gas layer and the color-converting filters, and thus the efficiency of extracting light is reduced. Moreover, with the constitution in which the gap is filled with an insulating oil or the like, this problem of reflection is alleviated, but the display manufacturing process becomes more complicated, and moreover the shock resistance, which is an intrinsic advantage of an organic EL display that is a completely solid device, is marred, and hence this constitution cannot be said to be the best.

As a constitution resolving these problems, in Japanese Patent No. 2766095 there is disclosed a constitution in which an organic EL device, and color-converting filters that face a transparent electrode on an upper part of the organic EL device are firmly bonded together via a transparent resin layer. However, with this constitution, there is a problem of damage such as peeling away of the EL device occurring through mechanical stress such as vibration or pressure or thermal stress produced, for example, through changes in the temperature of the environment in which the manufactured display is placed or during the step of bonding the organic EL device and the color-converting filters together.

Furthermore, in Japanese Patent Application Laid-open No. 11-121164, there is disclosed a constitution in which a base film, which is a resin film, and a binding layer, which is also a resin film, are formed between an organic EL device and color-converting filters with the binding layer on the color-converting filter side. In Japanese Patent Application Laid-open No. 11-121164, it is stated that the roles of the binding layer are to flatten out level differences on the color-converting filters, and to function as a cushioning film between the color-converting filters and the base film. However, in Japanese Patent Application Laid-open No. 11-121164, no consideration is given to adjusting the gap between the color-converting filters and the organic EL device. Moreover, the binding layer is made to function merely as a cushioning film with the base film, and there are no suggestions regarding relieving stress on the crucial organic EL device. Furthermore, the invention of Japanese Patent Application Laid-open No. 11-121164 does not have TFTs, and hence there is no mention of resolving problems peculiar to an organic EL display having TFTs as in the invention.

SUMMARY OF THE INVENTION

According to the invention, to resolve the various problems described above, in the case of an organic EL display, having on a substrate thin film transistors that each have a source and a drain, and an organic EL device in which first electrodes that are made of an electrically conductive thin film material and are each connected to the source or the drain, at least an organic EL light-emitting layer, a second electrode that is an upper transparent electrode made of a transparent electrically conductive thin film material, and at least one passivation layer are built up on the thin film transistors and which is driven by the thin film transistors, color-converting layers alone or laminates of color filter layers and color-converting layers that are formed on a transparent supporting substrate being disposed facing the second electrode side of the organic EL device, it is made to be such that at least two overcoat layers having different Young's moduli to one another are laminated on the second electrode side of the color-converting layers alone or the laminates of color filter layers and color-converting layers, and out of the overcoat layers, an overcoat layer on the second electrode side is made to be in close contact with the surface of the passivation layer, and the substrate and the supporting substrate are sealed and bonded together at a periphery thereof. Note that in the case of using laminates of color filter layers and color-converting layers, for example in the case that the light emitted from the organic EL device is blue in color, for blue, color filter layers only are used, and for green and red, laminates of color filter layers and color-converting layers are used.

In the invention, it is preferably made to be such that, out of the at least two overcoat layers having different Young's moduli to one another, the overcoat layer having the lowest Young's modulus is in close contact with the surface of the passivation layer within a display area of the organic EL device.

In this way, in the invention, between a substrate having TFTs formed thereon and a transparent substrate that is a supporting substrate having at least color-converting layers formed thereon, an overcoat layer for gap adjustment is disposed on the transparent substrate side, and an overcoat layer for relieving stress is formed on the substrate side (i.e. the organic EL device side), this being in facing relation with no space being provided; in particular, by providing the overcoat layer for relieving stress, which has a relatively low Young's modulus, gas voids that would have an adverse effect on the display performance can be prevented from occurring at the interface with the passivation layer. That is, the overcoat layer having the lowest Young's modulus is made to be in close contact with the passivation layer within the display area, and thus fills up spaces produced by undulations caused by TFT wiring, and moreover relieves mechanical stress and thermal stress to which the organic EL display is subjected from the environment. The undulations due to the wiring on the TFT substrate are approximately 1 to 2 μm in size, and hence the thickness of the overcoat layer having the lowest Young's modulus that fills up these undulations is suitably 2 to 4 μm.

BRIEF DESCRIPTION OF THE DRAWING FIGURES

DETAILED DESCRIPTION OF THE PREFERRED EMBODIMENTS

Figure 1:
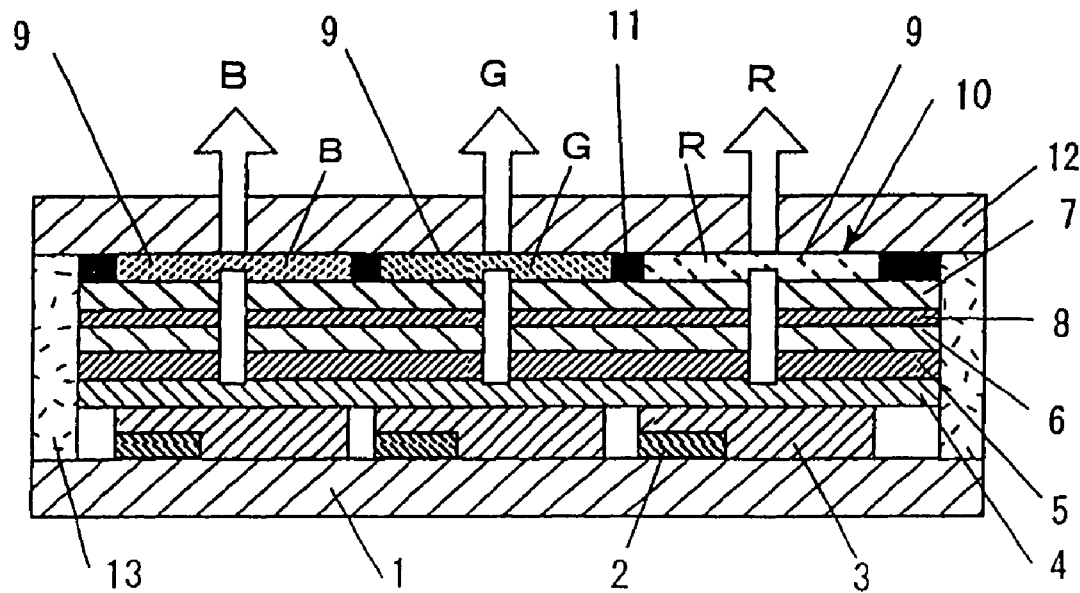
FIG. 1 is a schematic sectional view showing the constitution of an organic EL display of the invention.

Following is a description of an embodiment of an organic EL display of the invention.

The following description describes the exemplary case that first electrodes are anodes and a second electrode is a cathode, but it is also possible to make the first electrodes (lower electrodes) be cathodes and make the second electrode (upper electrode) be an anode.

1: Thin Film Transistor (TFT) Substrate and Anodes

TFTs are arranged in a matrix on an insulating substrate made of glass, plastic or the like, or a substrate obtained by forming an insulating thin film on a semiconductive or conductive substrate, and source electrodes are connected to the anodes in correspondence with the pixels.

The TFTs are of a bottom gate type in which a gate electrode is provided below a gate insulating film, and a polycrystalline silicon film is used as an active layer.

The anodes are formed on a flattening insulating film formed on the TFTs. With an ordinary organic EL device, indium tin oxide (ITO), which is transparent and has a high work function, is used as the anode material, but in the case of the top emission structure, it is preferable to use an electrode of a metal having high reflectivity (aluminum, silver, molybdenum, or tungsten) below the ITO.

2: Organic EL Device

For the organic EL device, one having a layer structure such as the following is adopted.

(1) Anodes, organic EL light-emitting layer, cathode (2) Anodes, hole injection layer, organic EL light-emitting layer, cathode (3) Anodes, organic EL light-emitting layer, electron injection layer, cathode (4) Anodes, hole injection layer, organic EL light-emitting layer, electron injection layer, cathode (5) Anodes, hole injection layer, hole transport layer, organic EL light-emitting layer, electron injection layer, cathode.

With the top emission color conversion structure of the present embodiment, in the above layer structures, the cathode must be transparent (i.e. have a transmissivity of at least approximately 50%) in the wavelength region of the light emitted by the organic EL light-emitting layer, the light being emitted via this cathode. Note that when the Aorganic EL layer@ is referred to in the present specification, this may include a hole injection layer, a hole transport layer, and/or an electron injection layer.

The transparent cathode is made to have a structure in which an ultra-thin film (not more than 10 nm) of an electron-injecting metal selected from alkali metals such as lithium and sodium, alkali earth metals such as potassium, calcium, magnesium and strontium, and fluorides and so on thereof, or an alloy thereof with other metals or a compound thereof is used as an electron injection layer, and a transparent electrically conductive film of ITO, IZO or the like is formed thereon.

Publicly-known materials are used as the materials of the various layers of the organic EL light-emitting layer. For example, to obtain luminescence from blue to blue/green in color, for example a fluorescent whitening agent of benzothiazole type, benzimidazole type, benzoxazole type or the like, a metal chelated oxonium compound, a styrylbenzene type compound, an aromatic dimethylidene type compound, or the like is preferably used as the organic EL layer.

3: Passivation Layer

For a passivation layer on the organic EL device, a material that is electrically insulating, acts as a barrier against moisture and low-molecular-weight components, has high transparency in the visible region (a transmissivity of at least 50% in a range of 400 to 700 nm), and preferably has a film hardness of at least 2 H is used.

For example, an inorganic oxide or inorganic nitride such as $SiO_x$, $SiN_x$, $SiN_xO_y$, $AlO_x$, $TiO_x$, $TaO_x$ or $ZnO_x$, or the like can be used. There are no particular limitations on the method of forming the passivation layer so long as there is no adverse effect on the organic EL device; the passivation layer can be formed using sputtering, CVD, vacuum deposition or the like. So long as there is no direct effect on the device, the passivation layer can also be formed using a commonly used method such as dipping.

The passivation layer may be a single layer, but the effects of the passivation layer such as the barrier ability against moisture will be greater with a passivation layer comprising a plurality of layers formed on top of one another.

The thickness of such a multi-layered passivation layer is preferably 0.1 to 5 μm.

4: Overcoat Layers

Overcoat layers may be formed on the organic EL device side, but the organic EL device is constituted from materials that are susceptible to heat and ultraviolet radiation, and hence there will be various constraints in the case of forming overcoat layers on the organic EL device. It is thus more preferable to form overcoat layers on the color-converting layers, which are stronger to heat and ultraviolet radiation.

As an overcoat layer furthest from the passivation layer, one that can be formed on the color-converting layers without marring the functions of the color-converting layers, and has high elasticity is preferable; a material that has high transparency in the visible region (a transmissivity of at least 50% in a range of 400 to 700 nm), Tg of at least 100° C., and a surface hardness of at least pencil hardness 2 H, for which a smooth coating film can be formed on the color-converting layers, and that does not cause deterioration in the functions of the color-converting filter layers is preferable, with examples being light-curable resins and/or heat-curable resins such as imide-modified silicone resins (see Japanese Patent Application Laid-open No. 5-134112, etc.), materials obtained by dispersing an inorganic metal compound (TiO, $Al_2O_3$, $SiO_2$, etc.) in an acrylic, polyimide or silicone resin or the like (see Japanese Patent Application Laid-open No. 5-119306, etc.), epoxy-modified acrylate resins, which are UV-curable resins (see Japanese Patent Application Laid-open No. 7-48424), resins that are an acrylate monomer/oligomer/polymer mixture having reactive vinyl groups, resist resins (see Japanese Patent Application Laid-open No. 6-300910, Japanese Patent Application Laid-open No. 9-330793, etc.), sol-gel method inorganic compounds (see Gekkan Display, 1997, Vol. 3, No. 7, etc.), and fluororesins (see Japanese Patent Application Laid-open No. 5-36475, etc.). The Young's modulus is preferably at least 0.3 MPa. This overcoat layer is for keeping the gap described in the Aproblems@ section constant, and if the Young's modulus is less than 0.3 MPa, then it will no longer be possible to keep this gap constant under external stress.

An overcoat layer closest to the passivation layer may be, for example, a polymeric material that does not contain rigid groups in the unit structure thereof such as a polyamide resin such as nylon 6 or nylon 6—6, or a silicone rubber or gel, any of various synthetic rubbers, or the like. Specifically, a material having a Young's modulus of not more than 0.3 MPa is preferable, more preferably not more than 0.1 MPa. However, at less than 0.01 MPa, it will not be possible to maintain the shape during layer formation, and hence the material is made to have a Young's modulus of at least 0.01 MPa.

A photoresist can also be used if the photoresist contains a straight chain oligomer not containing rigid groups or a monomer having not more than three functional groups as a raw material thereof, and the three-dimensional crosslink density of the cured material is not very high. Alternatively, a photoresist other than this can be used as the stress-relieving layer by being used in a state in which the crosslink density has been made to not become very high through weakening the irradiation with light or the amount of heating.

5: Color-converting Filters (Color-converting Layers+Color Filters)

1) Organic fluorescent colorants

In the invention, as organic fluorescent colorants for use in the color-converting layers, examples of fluorescent colorants that absorb light from the blue to blue/green region emitted from the light emitter and emit fluorescence in the red region are rhodamine type colorants such as Rhodamine B, Rhodamine 3B, Rhodamine 101, Rhodamine 110, sulforhodamines, Basic Violet 11 and Basic Red 2, cyanine type colorants, pyridine type colorants such as 1-ethyl-2-[4-(p-dimethylaminophenyl)-1,3-butadienyl]pyridinium perchlorate (Pyridine 1), oxazine type colorants, and so on. Furthermore, various dyes (direct dyes, acid dyes, basic dyes, disperse dyes, etc.) can also be used if fluorescent.

Examples of fluorescent colorants that absorb light from the blue to blue/green region emitted from the light emitter and emit fluorescence in the green region are coumarin type colorants such as 3-(2'-benzothiazolyl)-7-diethylaminocoumarin (Coumarin 6), and Basic Yellow 51, which is a coumarin colorant type dye, and also naphthalimide type colorants such as Solvent Yellow 11 and Solvent Yellow 116, and so on. Furthermore, various dyes (direct dyes, acid dyes, basic dyes, disperse dyes, etc.) can also be used if fluorescent.

2) Black Mask Resin

Next, a matrix resin used in the color-converting filters in the invention is a light-curable or joint-light/heat-curable resin that is made insoluble and unmeltable by carrying out light and/or heat treatment, thus generating radical species or ionic species and hence polymerizing or crosslinking the resin.

3) Color Filter Layers

In the case that sufficient color purity cannot be obtained with only the color-converting layers, the color-converting filters are made to be laminates of color filter layers and the color-converting layers. The color filter layers preferably have a thickness of 1 to 1.5 μm.

Following is a description of an example of the invention together with a comparative example.

EXAMPLE

Figure 2:
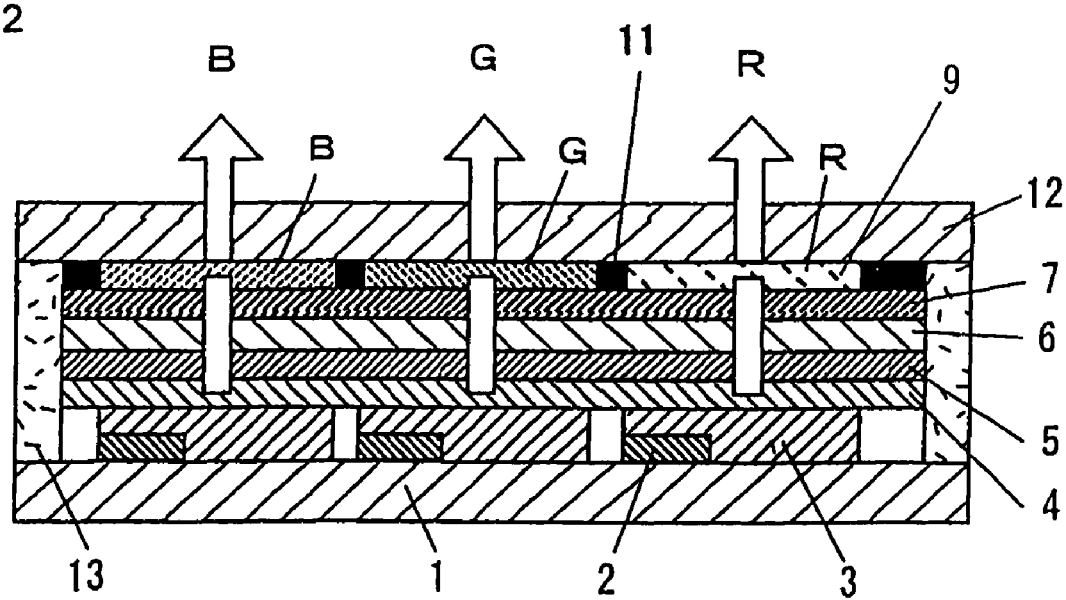
FIG. 2 is a schematic sectional view showing the constitution of a comparative example in the invention.

Following is a description of an example of the invention with reference to FIG. 1. FIG. 1 is a schematic sectional view of an organic EL display of the example of the invention. FIG. 2 is a comparative example in the invention.

TFT substrate (1, 2, 3)

As shown in FIG. 1, a constitution was adopted in which bottom gate type TFTs 2 were formed on a glass (first or base) substrate 1, and the source of each TFT was connected to an anode 3.

For each of the anodes 3, aluminum, which was connected to the source of the corresponding TFT via a contact hole formed in an insulating film on the TFT, not shown, was formed as a lower part, and IZO (InZnO) was formed on the upper surface thereof.

The aluminum is provided to reflect light emitted from the light-emitting layer so that light is discharged efficiently from the top, and to reduce the electrical resistance. The thickness of the aluminum film was made to be 300 nm. The upper part IZO has a high work function, and hence is provided so that holes can be injected efficiently. The thickness of the IZO was made to be 200 nm.

Organic EL Layer 4

An organic EL device was constituted from the anodes 3, an organic EL layer 4, and a cathode 5, shown in FIG. 1. The EL layer 4 comprises four layers: a hole injection layer, a hole transport layer, an organic EL light-emitting layer, and an electron injection layer.

The substrate 1 having the anodes 3 formed thereon was put into a resistive heating vapor deposition apparatus, and the hole injection layer, the hole transport layer, the organic EL light-emitting layer, and the electron injection layer were deposited in this order without releasing the vacuum. During the deposition, the pressure inside the vacuum chamber was reduced down to $1H10^{-4}$ Pa. Copper phthalocyanine (CuPc)

was formed to a thickness of 100 nm as the hole injection layer. 4,4'-bis[N-(1-naphthyl)-N-phenylamino]biphenyl (α-NPD) was formed to a thickness of 20 nm as the hole transport layer. 4,4-bis(2,2'-diphenylvinyl)biphenyl (DPVBi) was formed to a thickness of 30 nm as the organic EL light-emitting layer. An aluminum chelate (Alq) was formed to a thickness of 20 nm as the electron injection layer.

After that, a transparent cathode 5 was formed using a metal mask without releasing the vacuum.

The transparent cathode 5 was formed by depositing metallic Mg/Ag, which has a low work function as required for injection of electrons, to a thickness of 2 nm using a codeposition method, and then depositing an IZO film thereon to a thickness of 200 nm using a sputtering method.

Passivation Layer 6

An $SiON_x$ film was deposited by sputtering to a thickness of 300 nm as a passivation layer 6.

Color Filter Layers 9

A blue filter material (made by Fuji Hunt Electronics Technology; Color Mosaic CB-7001) was applied using a spin coating method onto a transparent (glass) substrate 12, and then patterning was carried out using a photolithography method, thus obtaining a line pattern with a thickness of 10 μm.

Red and green color filter layers (not shown) made of similar color filter materials were applied using a spin coating method onto the transparent substrate 12, and then patterning was carried out using a photolithography method, thus obtaining line patterns with a thickness of 1.5 μm.

Color-converting Layers 10

Coumarin 6 (0.7 parts by weight) as a green fluorescent colorant was dissolved in 120 parts by weight of a propylene glycol monoethyl acetate (PGMEA) solvent. 100 parts by weight of a photopolymerizable resin AV259PA/P5@ (trade name, Nippon Steel Chemical Co., Ltd.) was then added and dissolved, thus obtaining a coating liquid. This coating liquid was applied using a spin coating method onto the green color filters on the transparent substrate 12, and then patterning was carried out using a photolithography method, thus obtaining a line pattern with a thickness of 10 μm.

Coumarin 6 (0.6 parts by weight), Rhodamine 6G (0.3 parts by weight) and Basic Violet 11 (0.3 parts by weight) as red fluorescent colorants were dissolved in a PGMEA solvent. 100 parts by weight of the V259PA/P5 photopolymerizable resin was then added and dissolved, thus obtaining a coating liquid. This coating liquid was applied using a spin coating method onto the red color filters on the transparent substrate 12, and then patterning was carried out using a photolithography method, thus obtaining a line pattern with a thickness of 10 μm.

A black mask 11 (thickness 10 μm) was formed between the color-converting layers 10 of the various colors. As a black mask having high thermal conductivity, first 500 nm of chromium oxide was formed by sputtering using a mask enabling formation of a lattice pattern on walls of the color-converting layers. Next, using a similar mask, an SiN film was formed by sputtering around the red, green and blue pixels so as to be the same thickness. The pitch of the pixels was 0.3 (0.3 mm, and the shape of the sub-pixels of the various colors was 0.1 (0.3 mm.

First Overcoat Layer 7

ZPN 1100 (made by Nippon Zeon Co., Ltd.) (Young's modulus approximately 5 MPa) was applied using a spin coating method onto an upper surface of the color-converting layers 10, and then patterning was carried out using a photolithography method, thus forming a first overcoat layer 7 on the color-converting layers 10. The thickness from the surface of the color-converting layers 10 was 3 μm.

Second Overcoat Layer 8

A silicone gel (made by Toray-Dow Corning) (Young's modulus approximately 0.05 MPa) for relieving stress and also covering unevenness of the TFT wiring was coated onto the first overcoat layer 7 using a screen printing method. The thickness at the time of the screen printing was 4 to 5 μm, but this thickness can be approximately halved through the step of bonding together by applying pressure.

The method of applying on the silicone gel is not limited to being screen printing, but rather the required amount may be merely dripped on, or means such as a bar coater or an edge coater enabling formation of a thin layer may be used.

(Bonding Together)

The substrate 1 having the organic EL device and the passivation layer 6 formed on the TFTs 2, and the transparent substrate 12 having the color filter layers 9, the color-converting layers 10, the black mask 11, the first overcoat layer 7 and the second overcoat layer 8 formed thereon obtained as described above were bonded together using a UV-curing sealing resin 13. A UV-curing epoxy adhesive or a UV-curing acrylic adhesive is used as the sealing resin 13.

At this time, the second overcoat layer 8 comes into close contact with, but is not bonded to, the passivation layer 6. This is because if the second overcoat layer 8 were bonded to the passivation layer 6, then upon being subjected to stress from the outside, defects would arise such as peeling away on the EL device side where the adhesive strength is weakest.

Note that in the present example, two overcoat layers were used, but a constitution is also possible in which a third overcoat layer having a yet lower Young's modulus is formed and is made to be in close contact with the passivation layer, whereby spaces due to unevenness at the interface can be eliminated more completely.

Comparative Example

A negative type resist AJNPC-48 @ (made by JSR) was used as a first overcoat layer (transparent resin adhesive layer 7), and then, without providing a second overcoat layer, the transparent substrate 12 and the substrate 1 were bonded together using a polycarbonate. Other conditions were made to be the same as in Example.

This example is illustrated in FIG. 2.

(Evaluation)

Evaluation was carried out for the following item. The results are shown in Table 1. A Heat cycle test: The manufactured display was subjected to a heat cycle test (!40° C.: 95° C., 120 cycles, temperature raising/decreasing time less than 5 min), and it was observed whether or not abnormalities in the form arose.

TABLE 1

|  | Example | Comparative Example |
| --- | --- | --- |
| Heat cycle | No change in form | Peeling away of organic light-emitting device occurs |

According to the invention, the following effects are obtained.

First, the color-converting filters and the black mask cannot necessarily be formed with the same thickness, and moreover recesses may be formed between patterns due to misalignment occurring during the patterning; such undulations can be flattened out by the first overcoat layer. In addition, the gap between the color-converting filters (color-converting layers) and the organic EL device can be adjusted through this first overcoat layer.

Furthermore, by providing the second overcoat layer which has a lower Young's modulus (i.e. is more flexible), small undulations due to wiring on the TFT substrate, which is a problem peculiar to devices having TFTs, can be covered, and hence gas voids that would have an adverse effect on the display performance can be prevented from occurring at the interface with the passivation layer. Furthermore, the second overcoat layer also fulfils a role of relieving stress, and hence the occurrence of stress due to the external environment such as thermal stress can be suppressed; an organic EL display having high reliability can thus be provided.

The invention claimed is:

1. An organic electroluminescent display, comprising:
    a base substrate;
    thin film transistors, disposed on the base substrate, each including a source and a drain;
    an organic electroluminescent device, built up on the thin film transistors and driven by the thin film transistors, the organic electroluminescent device further including first electrodes that comprise an electrically conductive thin film material and that are each connected to the source or the drain, at least an organic electroluminescent light-emitting layer, and an upper second electrode that is a transparent electrode comprising a transparent electrically conductive thin film material;
    at least one passivation layer;
    at least two overcoat layers, the at least two overcoat layers having Young's moduli different from one another;
    a color layer, further comprising color-converting layers alone or laminates of color filter layers and color-converting layers; and
    a supporting transparent substrate, the color layer being formed on a side of the supporting transparent substrate facing the organic electroluminescent device;
    wherein the at least two overcoat layers are laminated onto a second-electrode side of the organic electroluminescent device, and one of the at least two overcoat layers is in close contact with the surface of the passivation layer; and
    wherein the substrate and the supporting substrate are sealed and bonded together at a periphery thereof.

2. The organic electroluminescent display according to claim 1, wherein, out of the at least two overcoat layers having Young's moduli different from one another, the overcoat layer having the lowest Young's modulus is in close contact with the surface of the passivation layer within a display area of the organic electroluminescent device.

3. The organic electroluminescent display according to claim 1, wherein the elements of the display are arranged in the order of recitation.

* * * * *